(12) United States Patent
Chien et al.

(10) Patent No.: US 10,861,777 B2
(45) Date of Patent: Dec. 8, 2020

(54) WIRE BOND CLAMP DESIGN AND LEAD FRAME CAPABLE OF ENGAGING WITH SAME

(71) Applicant: TEXAS INSTRUMENTS INCORPORATED, Dallas, TX (US)

(72) Inventors: Yuh-Harng Chien, New Taipei (TW); Hung-Yu Chou, Taipei (TW); Fu-Kang Lee, New Taipei (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 105 days.

(21) Appl. No.: 15/856,346

(22) Filed: Dec. 28, 2017

(65) Prior Publication Data

US 2019/0206769 A1    Jul. 4, 2019

(51) Int. Cl.
*H01L 23/495* (2006.01)
*H01L 23/544* (2006.01)
*H01L 23/00* (2006.01)
*H01L 25/065* (2006.01)

(52) U.S. Cl.
CPC .. *H01L 23/49544* (2013.01); *H01L 23/49541* (2013.01); *H01L 23/544* (2013.01); *H01L 24/78* (2013.01); *H01L 24/85* (2013.01); *H01L 25/0655* (2013.01); *H01L 23/4952* (2013.01); *H01L 23/49503* (2013.01); *H01L 23/49575* (2013.01); *H01L 24/48* (2013.01); *H01L 24/49* (2013.01); *H01L 2223/54426* (2013.01); *H01L 2224/05554* (2013.01); *H01L 2224/48091* (2013.01); *H01L 2224/48137* (2013.01); *H01L 2224/48247* (2013.01); *H01L 2224/49113* (2013.01); *H01L 2224/78704* (2013.01); *H01L 2224/85122* (2013.01); *H01L 2224/85136* (2013.01); *H01L 2224/85201* (2013.01); *H01L 2224/85203* (2013.01); *H01L 2224/85205* (2013.01); *H01L 2924/00014* (2013.01); *H01L 2924/35* (2013.01); *H01L 2924/37001* (2013.01); *H01L 2924/386* (2013.01)

(58) Field of Classification Search
CPC ......... H01L 23/49541; H01L 23/49544; H01L 23/49575; H01L 23/544
See application file for complete search history.

(56) References Cited

U.S. PATENT DOCUMENTS 6,677,662 B1 * 1/2004 Chung .................... H01L 23/34
257/666
2009/0278248 A1 * 11/2009 Matsumura ....... H01L 23/49503
257/690

* cited by examiner

*Primary Examiner* — Douglas M Menz
(74) *Attorney, Agent, or Firm* — Dawn Jos; Charles A. Brill; Frank D. Cimino

(57) ABSTRACT

Aspects of the disclosure relate generally to semiconductor packaging, and specifically to semiconductor device having a lead frame having a semiconductor supporting die pad that is capable of engaging with a wire bonding clamp.

13 Claims, 3 Drawing Sheets

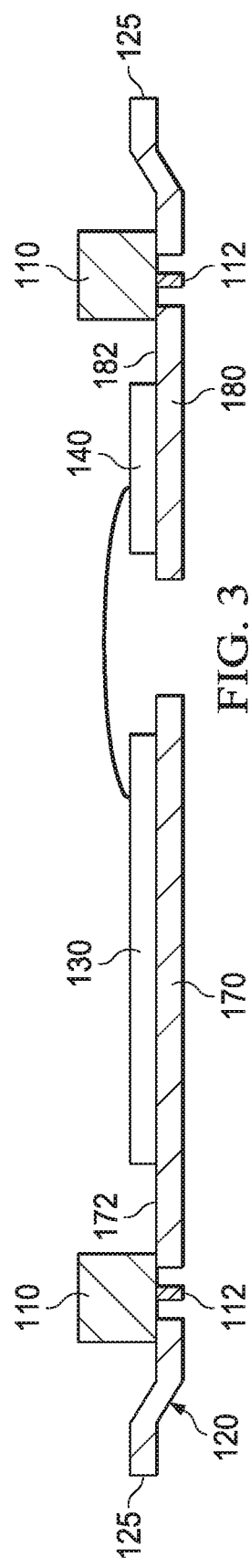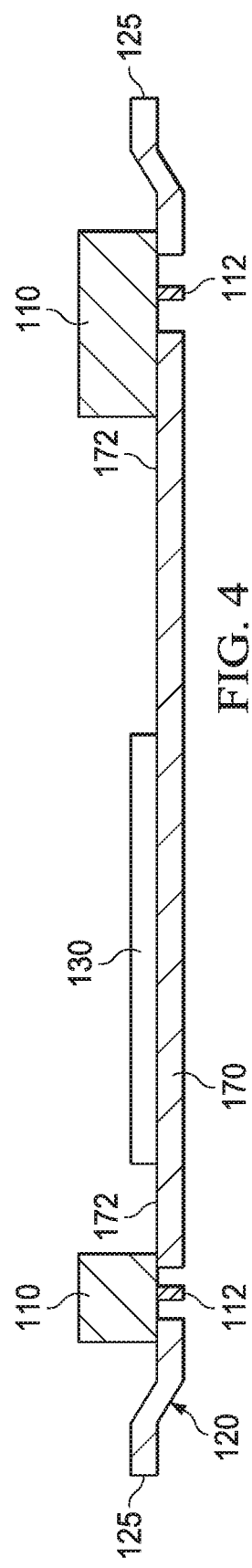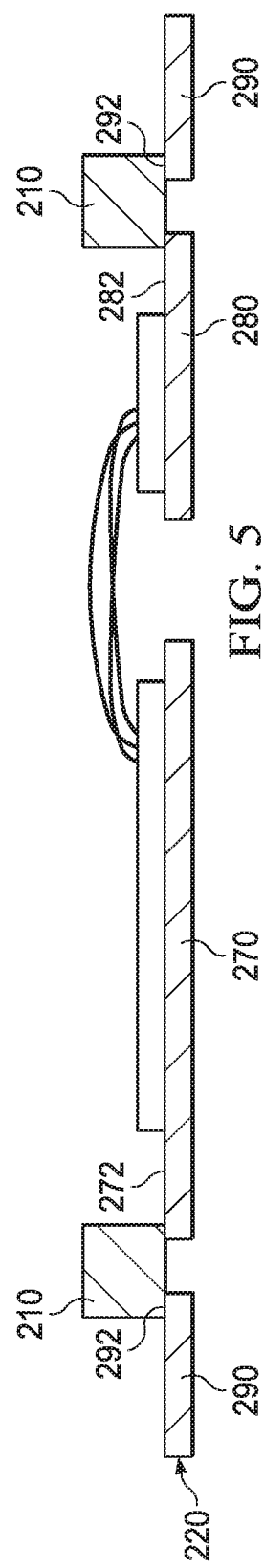

WIRE BOND CLAMP DESIGN AND LEAD FRAME CAPABLE OF ENGAGING WITH SAME

BACKGROUND

Wire bonded semiconductor devices typically have a lead frame that provides physical support and electrical connection of a semiconductor die to external circuitry. The lead frame includes an outer supporting frame, a central semiconductor die supporting pad and inwardly-extending leads terminating short of the perimeter of the die attach location. The central semiconductor die supporting pad and inwardly-extending leads are downset from the outer perimeter of the lead frame. Each semiconductor die supporting pad and inwardly-extending leads terminating short of the perimeter of the die attach location of the leads has a terminal bonding portion at the inner lead end. The outer supporting frame is ultimately removed subsequent to encapsulation of the wire-bonded die and leads, and forms no part of the finished device. The lead frame can be formed from copper alloy, red brass, stainless steel, or the like.

In the assembly of semiconductor devices with the above-described lead frames, a semiconductor die is secured to the central supporting pad of the lead frame. That device is then placed into a wire bonding apparatus that includes a damp assembly for holding the lead frame and die assembly, and clamping the lead fingers for bonding. This is generally referred to as "leads over chip" assembly or "LOC."

During the bonding process, the bond wires are attached to electrically connect a bond pad on the semiconductor die to a corresponding lead of the lead frame. The bond wires are typically attached by industry-standard wire bonding techniques: ultrasonic bonding—using a combination of pressure and ultrasonic vibration bursts to form a metallurgical cold weld; thermocompression bonding—using a combination of pressure and elevated temperature to form a weld; and thermosonic bonding—using a combination of pressure, elevated temperature, and ultrasonic vibration bursts.

Each of these wire bonding processes involves pressure applied to the lead frame during the clamping process. Because lead frames are typically downset, pressure applied by these methods to the outer perimeter of the lead frames result in stress and distortion of the lead frame resulting in poor wire bonding not only from the semiconductor device to the leads of the lead frame, but also from semiconductor die to semiconductor die. This poor wire bonding can, and often does, result in subsequent failure, which contributes to the number of semiconductor devices that are prone to failure. In addition, a "bouncing" motion is imparted to the lead fingers by wire bonding head movement; that "bouncing" movement can result in poor wire bonds that subsequently fail. For example, the bouncing movement results in non-stick on pad (NSOP), non-stick-on-lead (NSOL) bonding, and lift, smash, and malformed balls all resulting in semiconductor device failures, which results in higher manufacturing costs.

SUMMARY

Aspects of the disclosure relate to semiconductor devices having a lead frame having an outer perimeter and at least one semiconductor die supporting pad capable of engaging with a wire bond clamp, and inwardly-extending leads terminating short of the perimeter of the at least one semiconductor die supporting pad, the leads capable of engaging with the wire bond clamp, a semiconductor chip on said semiconductor die supporting pad.

Aspects of the disclosure also relate to a clamp capable of engaging with at least one semiconductor die supporting pad and inwardly-extending leads coupled to a lead frame. A further aspect of the disclosure relates to a clamp having a cavity such that a semiconductor chip coupled to the at least one semiconductor die supporting pad and inwardly-extending leads coupled to the lead frame are exposed.

Aspects of the disclosure further include wire bonds coupling the semiconductor chip to the inwardly-extending leads. Aspects of the disclosure further include a cavity of an appropriate configuration to allow a wire bonding tool to access the wire bonds coupling the semiconductor chip to the inwardly-extending leads. Aspects of the disclosure also include a cavity having an irregular shape.

Aspects of the disclosure also include a method of forming a wire bonded semiconductor device, comprising the steps of: providing a lead frame having an outer perimeter having; at least one semiconductor die supporting pad, and inwardly-extending leads terminating short of the perimeter of the at least one semiconductor die supporting pad; providing a semiconductor chip on said semiconductor die supporting pad; and providing a clamp over the lead frame and coupled to the perimeter of the at least one semiconductor die supporting pad and the inwardly-extending leads, and having a cavity such that the semiconductor chip and inwardly-extending leads are exposed.

BRIEF DESCRIPTION OF THE DRAWINGS

For a detailed description of various examples, reference will now be made to the accompanying drawings in which:

FIG. 3 illustrates a cross-sectional view of the FIG. 1 device taken along line 3;

FIG. 4 illustrates a cross-sectional view of the FIG. 1 device taken along line 4; and FIG. 5 illustrates a cross-sectional view of another semiconductor device having a lead frame coupled to a wire bonding clamp.

DETAILED DESCRIPTION

It would be advantageous to develop an apparatus and process for stabilizing a semiconductor die and the lead fingers during the wire bonding process to minimize or eliminate the bouncing motion and/or the movement of the semiconductor die or the lead fingers and thus compensate for the inherent deficiencies of the damping and wire bonding process.

Figure 1:
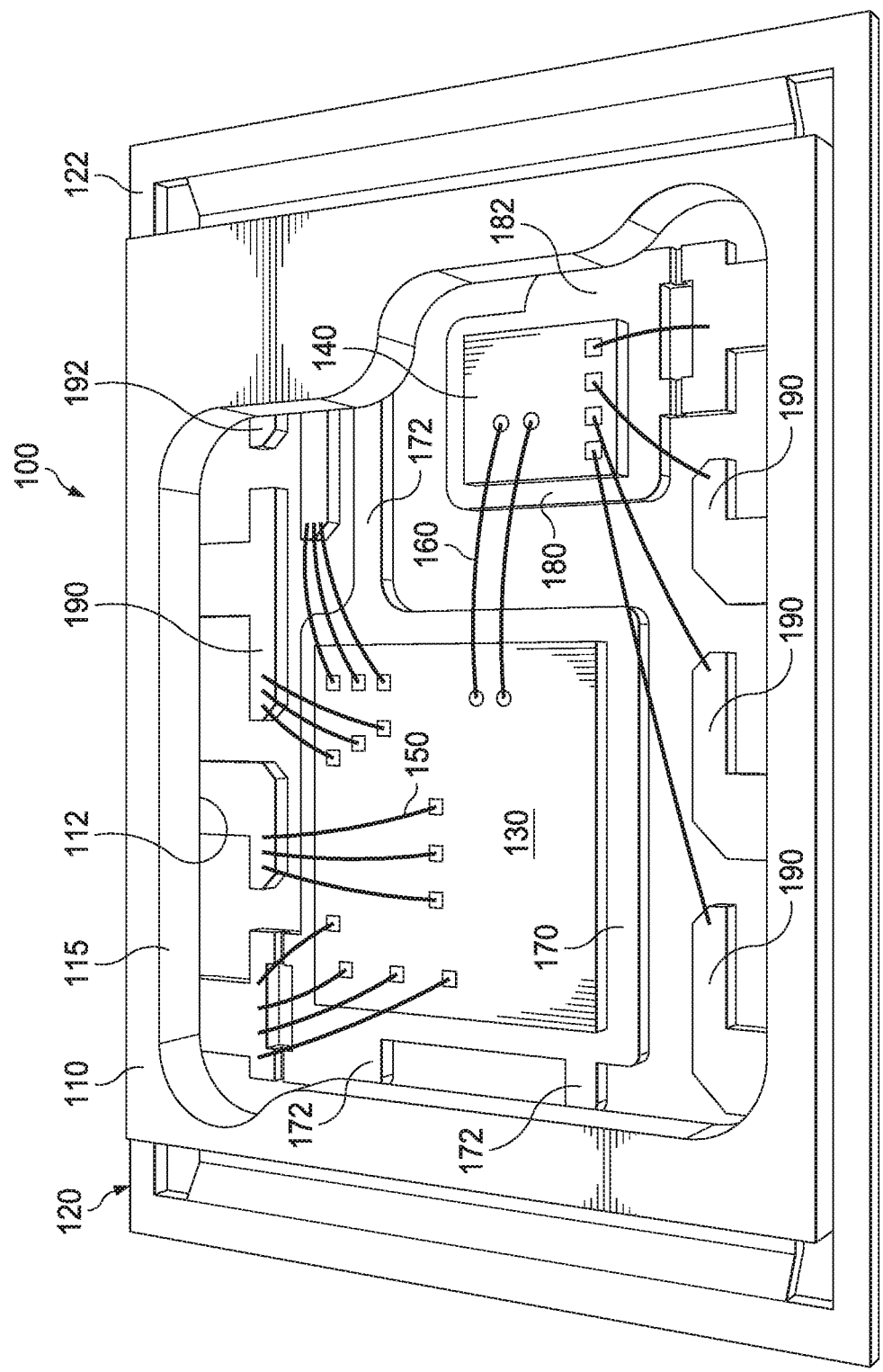
FIG. 1 illustrates an angled, top-down view of a semiconductor device having a lead frame coupled to a wire bonding clamp.

FIG. 1 illustrates an aspect of the disclosure in which a semiconductor device 100 has a customizable wire bond clamp 110 over a customizable lead frame 120 having first and second semiconductor chips 130 and 140 with wire first types and second types of wire bonds 150 and 160. The lead frame 120 includes an outer supporting frame 122, semiconductor die supporting pad(s) (e.g., first die pad 170 and second die pad 180) and inwardly-extending leads 190 terminating short of the perimeter of the die attach location (e.g., pads 170 and 180). The central semiconductor die supporting pads 170 and 180 and inwardly-extending leads 190 are planar to one another. Each semiconductor die supporting pad 170 and 180 includes at least one engaging feature 172 and 182, respectively, that can engage with the customizable clamp 110.

Similarly, the extending leads 190 terminating short of the perimeter of the die attach location have at least one engaging feature 192 that is capable of engaging with the customizable clamp 110. Each of the extending leads 190 has a terminal bonding portion at the inner lead end. The engaging members 172, 182, and 192 allow the customizable clamp 110 to engage directly with the engaging members 172, 182, and 192 during the wire bonding process.

Because the customizable clamp 110 is in closer proximity to the semiconductor die supporting pad 170 and 180 and the leads 190, and therefore applying pressure directly to those features, the clamp 110 provides more stability to those features during the wire bonding process than if the clamp 110 were applying pressure to the perimeter of the lead frame. This direct application of pressure minimizes the stress and distortion of the lead frame as compared with a clamp that applies pressure to the outer perimeter of the lead frame. This results in better wire bonding performance and decreased failure. In addition, the direct application of pressure to the elements that are being wire bonded minimizes the "bouncing" movement that can result from a clamp that attaches to the perimeter of the lead frame. This minimized "bouncing" movement results in less non-stick on pad (NSOP), non-stick-on-lead (NSOL) bonding, and lift, smash, and malformed balls.

Figure 2:
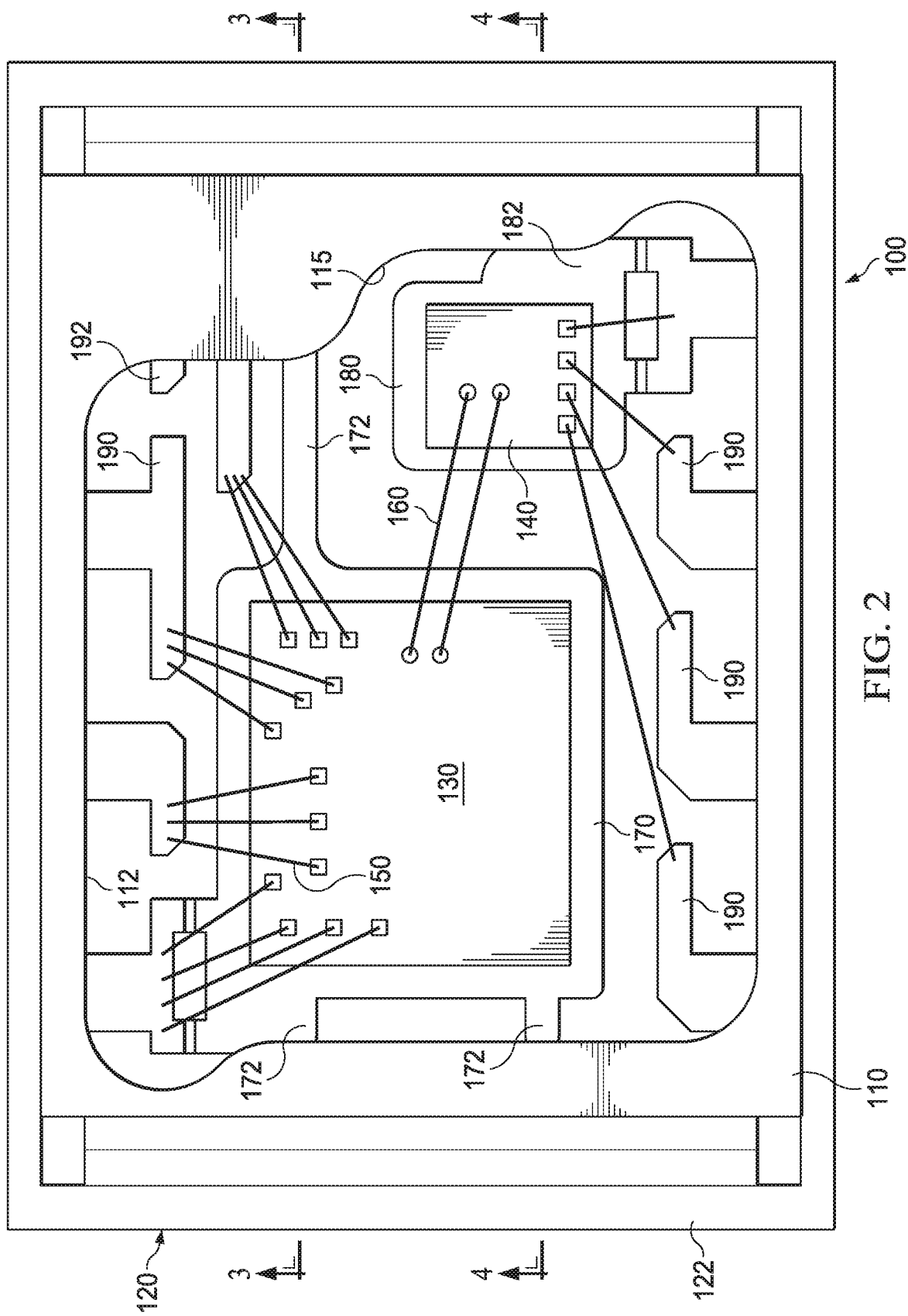
FIG. 2 illustrates a top-down view of the FIG. 1 device.

As illustrated in FIG. 2, the customizable clamp 110 is shaped such that it is capable of sitting on the engagement members 172, 182, and 192 to apply pressure to the first and second die pads 170 and 180 and extending leads 190. The engagement members 172 and 182 render the die pads 170 and 180 as irregularly shaped. As illustrated, the engagement members 172 of the first die pad 170 are shown as protrusions extending outwardly towards a perimeter 122 of the lead frame 120. Depending on the application, and the locations of the die and the engagement members, the engagement members could be small nubs extending laterally (and outwardly toward the outer perimeter of the lead frame) that are approximately 1/10 the length of the die pad 170 (measured from a top-view perspective) to extended fingers approximately 8/10 the length of the die pad. It should be noted that the approximate lengths of the engagement members relative to the die pads is not limiting. The lengths could be any length to ensure proper engagement with the clamp 110.

The engagement members of the die pad could also be shoulders that extend outwards from the die pad. For example, the engagement member 182 of the second die pad 180 is formed as a shoulder extending laterally from the side of the second die pad 180. As illustrated, the engagement member 182 is an extension of the second die pad 180, allowing the clamp 110 to sit directly adjacent to the second die pad 180, and thereby provide maximum stability to the second semiconductor chip 140.

Similarly, the engagement member 192 of the lead 190 is illustrated as having an irregular shape so that the clamp 110 can engage directly with a lead 190 that is intended to have multiple wire bonds attached thereto. Based on the placement of the wire bond connections on the first semiconductor chip 130 to the lead 190, the engagement member 192 is designed to have a first portion extend inwardly (away from the perimeter of the lead frame) and a second portion extend laterally (in the direction of the die pad 170) so that the clamp 110 can sit in close proximity to the wire bond connection points yet allow a wire bonding tool (not shown) access to the wire bond connection points. As illustrated the first and second portions are extending in a perpendicular fashion to one another (though that is not intended to be limiting).

FIG. 3 illustrates a cross-sectional view of the FIG. 2 example taken along line 3. As illustrated, the clamp 110 is engaged with engagement members 172 and 182. As illustrated, the clamp 110 has optional alignment features 112 that sit between portions of the lead frame leading to the raised features 125 of the lead frame 120 and the engagement members 172 and 182 of the first and second die pads 170 and 180, respectively. This allows the alignment of the clamp 110 to ensure the proper engagement between the clamp 110 and the engagement members 172 and 182. Alternatively, the clamp 110 could have other alignment features that engage with the engagement members 172, 182, 192. For example, the clamp 110 could have a surface that has raised portions that allow those portions to align with grooves formed in the engagement members 172, 182, and 192. Conversely, the grooves could be formed in the clamp surface 110 such that raised portions formed in the engagement members 172, 182, and 192 can align with the clamp grooves.

Referring back to FIG. 1, the customizable wire bond clamp 110 includes a cavity 115 that is customized to the particular dimensions of the first and second die pads 170 and 180, extending leads 190, and first types and second types wire bonding 150 and 160. As illustrated, the shape of the cavity 115 is an "amoeba-like" configuration. The cavity 115 is defined by the interior perimeter 112 of the customizable clamp 110.

The interior perimeter 112 has an irregular shape such that the wire bonding tool (not shown) can access the wire bonding features of the semiconductor device 100. For example, a wire bonding tool can enter the cavity 115 of the customizable clamp 120 to bond the first types and second types of wire bonds 150 and 160. The first types of wire bonds 150 are illustrated as wire bonds extending form the semiconductor chips 130 and 140 to the lead frame. The second types of wire bonds 160 are illustrated as extending form a first semiconductor chip 130 to a second semiconductor chip 140. The wire bonding tool attaches the first types and second types of wire bonds 150 and 160 to the lead frame 120 and to the first second semiconductor chips 130 and 140.

The outer perimeter 114 is illustrated as having a regular shape. However, the illustration is not intended to be limiting. As the interior perimeter 112 is customizable, so too can the outer perimeter 114.

The reduction or elimination of stress results in better performance and less failure. Testing surprising showed that the incidence rate of NSOP and NSOL failure dropped from 1.78% to 0.07% when comparing the prior art clamps and the clamps illustrated in the FIG. 1 example. This surprising reduction in failure rate increases yield and decreases manufacturing costs as a result.

It should be understood that the illustrated relative dimensions are given for illustration and proportional purposes only. It is understood that the actual clamp dimensions and configuration will vary depending on the semiconductor die size and the bond pad size and lead frame element patterns. The primary consideration is that the configuration be such that the force applied by the customizable clamp is reduced or eliminated during the wire bonding process to eliminate the bouncing motion and/or movement of the semiconductor die or the lead elements.

FIG. 4 is a cross-sectional view taken along line 4 of FIG. 2. As illustrated, the clamp is engaged with the engagement members 172 of the die pad 170. The clamp 110 sits directly on the engagement members 172 of the die pad 170. The clamp 110 is shown with optional alignment features 112 that sit between the engagement members 172 and the lead frame 120. This allows the alignment of the clamp 110 to ensure the proper engagement between the clamp 110 and the engagement members 172. As illustrated, the alignment features 112 are illustrated as cross-sectional portions of the clamp 120 that extend beyond an upper surface the engagement members 172, 182, and 192.

In operation, the bond wires are attached, one at a time, from each bond pad on the first and second semiconductor dies 130 and 140 to corresponding lead finger 190 and to one another. The bond wires can be attached by any one of three industry-standard wire bonding techniques: ultrasonic bonding—using a combination of pressure and ultrasonic vibration bursts to form a metallurgical cold weld; thermocompression bonding—using a combination of pressure and elevated temperature to form a weld; and thermosonic bonding—using a combination of pressure, elevated temperature, and ultrasonic vibration bursts.

To form a good bond during the wire bonding processing, the lead frame 120 having the first and second semiconductor dies 130 and 140 and wires that are temporarily held in place enter a processing machine (not shown). The lead frame 120 sits on a preferably heated surface of the processing machine. The clamp 110 is lowered onto the lead frame 120 such that the clamp engages with the engagement members 172, 182 and 192 (FIGS. 3 and 4). The clamp 110 can directly and indirectly apply pressure to the lead frame 120 by the engagement members 172, 182 and 192 (FIGS. 3 and 4).

A wire bonding tool (not shown) enters the cavity of the lead frame 120 and a wire bonding head stamps each of the wire bond connections extending from the semiconductor dies 130 and 140 to the leads 190 or to one another (as illustrated in FIG. 1). Because the clamp 110 holds the lead frame 120 (and the components thereon) against a surface of the processing machine while the wire bond head exerts force on the wire bond connections, the amount of movement of the lead frame during the wire bonding process is minimized. Similarly, the amount of "bounce" is also minimized. As a result, and as discussed above, the number of failures attributable to non-stick on pad (NSOP), non-stick-on-lead (NSOL) bonding, and lift, smash, and malformed balls is minimized.

It should also be noted that while the examples have been described with a downset lead frame, such a description is not intended to be limiting. For example, the lead frame could be a planar lead frame. For example, FIG. 5 illustrates a cross-sectional view of a semiconductor device 200 having a planar lead frame 220 with a first die pad 270 having a first engagement member 272 and a second die pad 280 having a second engagement member 282. The lead frame 22 also includes leads 290 having engagement members 292 that can engage with a clamp 220. As illustrated, claim 220 does not have alignment features like clamp 110 (FIG. 4). It should be understood, however, that the clamp 210 of FIG. 5 can have optional alignment features, if desired for the application.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A semiconductor device comprising:
   a first die supporting pad including a first extension, a second extension, and a third extension from the first die supporting pad;
   a second die supporting pad a fourth extension from the second die supporting pad; and
   a first semiconductor die attached to the first die supporting pad, and a second semiconductor die attached to the second die supporting pad, the first semiconductor die and the second semiconductor die electrically connected to at least some leads of a plurality of leads of the semiconductor device, the first semiconductor die electrically connected to the second semiconductor die;
   wherein:
   the first extension, and the second extension are parallel to each other from a top view of the semiconductor device;
   the third extension includes a wire bond attached thereto; and
   the fourth extension extends from two adjacent sides at an angle substantially perpendicular to each of the two adjacent sides of the second die supporting pad.

2. The semiconductor device of claim 1, wherein the third extension is capable of engaging directly with a wire bonding clamp.

3. The semiconductor device of claim 2, wherein the third extension extends from two adjacent sides of the first die supporting pad.

4. The semiconductor device of claim 3, wherein each of the third extension and the fourth extension includes a cavity.

5. The semiconductor device of claim 4, wherein the second extension is longer than the first extension.

6. The semiconductor device of claim 1, wherein the first die supporting pad is larger in area than the second die supporting pad.

7. The semiconductor device of claim 1, wherein the first semiconductor die is larger than the second semiconductor die.

8. A semiconductor device comprising:
   a first die supporting pad including a first extension, a second extension, and a third extension from the first die supporting pad;
   a second die supporting pad a fourth extension from the second die supporting pad; and
   a first semiconductor die attached to the first die supporting pad, and a second semiconductor die attached to the second die supporting pad, the first semiconductor die and the second semiconductor die electrically connected to at least some leads of a plurality of leads of the semiconductor device, the first semiconductor die electrically connected to the second semiconductor die; wherein the first extension, and the second extension extend in opposite directions parallel to each other from a top view of the semiconductor device, and wherein each of the third extension and the fourth extension includes a cavity.

9. The semiconductor device of claim 8, wherein the third extension includes a wire bond attached thereto.

10. The semiconductor device of claim 8, wherein the fourth extension extends from two adjacent sides of the second die supporting pad.

11. The semiconductor device of claim 8, wherein the fourth extension extends from two adjacent sides at an angle substantially perpendicular to each of the two adjacent sides of the second die supporting pad.

12. The semiconductor device of claim 8, wherein surfaces of the first die supporting pad and the second die supporting pad are parallel to each other.

13. The semiconductor device of claim 8, wherein the third extension and the fourth extension are part of the plurality of leads of the semiconductor device.

* * * * *